United States Patent [19]

Koenck et al.

[11] Patent Number: 6,058,000
[45] Date of Patent: May 2, 2000

[54] METHOD AND APPARATUS FOR ELECTROMAGNETIC SHIELDING AND ELECTROSTATIC DISCHARGE PROTECTION

[75] Inventors: Steven E. Koenck, Cedar Rapids, Iowa; George E. Hanson, Andover, Kans.; David A. Harris, Solon, Iowa; Patrick H. Davis; Dennis A. Durbin, both of Cedar Rapids, Iowa

[73] Assignee: Intermec IP Corp., Woodland Hills, Calif.

[21] Appl. No.: 08/419,664

[22] Filed: Apr. 12, 1995

Related U.S. Application Data

[63] Continuation-in-part of application No. 08/353,778, Dec. 12, 1994, abandoned, and a continuation-in-part of application No. 08/171,390, Dec. 21, 1993, Pat. No. 5,517,434, which is a continuation-in-part of application No. 07/561,994, Jul. 31, 1990, abandoned.

[51] Int. Cl.[7] .................................................. H02H 1/00
[52] U.S. Cl. .......................... 361/113; 361/56; 361/91.1; 361/118
[58] Field of Search ............................ 361/111, 56, 91, 361/118, 119, 113, 818; 307/91

[56] References Cited

U.S. PATENT DOCUMENTS

| | | | |
|---|---|---|---|
| 3,390,319 | 6/1968 | Robison | 320/2 |
| 3,621,265 | 11/1971 | Berler | 250/219 D |
| 3,659,180 | 4/1972 | Urbush | 320/2 |
| 4,251,798 | 2/1981 | Swartz et al. | 340/146.354 |
| 4,258,253 | 3/1981 | Fisher | 235/439 |
| 4,345,146 | 8/1982 | Story et al. | 235/381 |
| 4,370,700 | 1/1983 | Duddles et al. | 361/818 |
| 4,377,741 | 3/1983 | Brekka et al. | 235/472 |
| 4,387,297 | 6/1983 | Swartz | 235/462 |
| 4,458,238 | 7/1984 | Learn | 340/365 R |
| 4,460,120 | 7/1984 | Shepard et al. | 235/472 |
| 4,471,218 | 9/1984 | Culp | 235/472 |
| 4,496,831 | 1/1985 | Swartz et al. | 235/472 |
| 4,554,608 | 11/1985 | Block | 361/119 |
| 4,603,262 | 7/1986 | Eastman et al. | 250/566 |
| 4,628,193 | 12/1986 | Blum | 235/375 |
| 4,684,793 | 8/1987 | Kamhuber | 235/449 |
| 4,695,919 | 9/1987 | Wendt | 361/119 |
| 4,706,096 | 11/1987 | Sato | 346/76 PH |
| 4,713,617 | 12/1987 | Michalski | 324/395 |
| 4,721,849 | 1/1988 | Davis et al. | 235/472 |
| 4,757,183 | 7/1988 | Karrey et al. | 219/365 |
| 4,758,717 | 7/1988 | Shepard et al. | 235/472 |
| 4,760,248 | 7/1988 | Swartz et al. | 235/472 |
| 4,773,032 | 9/1988 | Uehara et al. | 364/709.04 |
| 4,805,175 | 2/1989 | Knowles | 372/24 |
| 4,808,018 | 2/1989 | Robertson et al. | 400/121 |
| 4,862,311 | 8/1989 | Rust et al. | 361/119 |
| 4,916,441 | 4/1990 | Gombrich | 345/169 |

(List continued on next page.)

FOREIGN PATENT DOCUMENTS 0 385 502  9/1990  European Pat. Off. .

OTHER PUBLICATIONS

Author: P.J. Kennedy, Title: Hand–Held Data Input Device, Date: Apr. 1984 From: IBM Technical Disclosure Bulletin, pp.: 5826–5827.

*Primary Examiner*—Stephen W. Jackson
*Attorney, Agent, or Firm*—Suiter & Associates PC

[57] ABSTRACT

The present invention provides protection from electromagnetic interference and electrostatic discharge. The invention teaches a shielding conductor surface enclosure, an interior shielding conductor plane, a contact conductor from the shielding conductor plane and the shielding conductor surface enclosure, a path for electromagnetic signals to pass through a shielding conductor plane, a filter network, and an electrostatic voltage clamp. Protection is provided by filtering the incoming signals, electrically coupling the signals of an undesired bandwidth to a shield barrier, and electrically coupling signals of an undesired voltage to a shield barrier. The shield surface is physically differentiated from the ground plane surface.

22 Claims, 3 Drawing Sheets

U.S. PATENT DOCUMENTS

| | | | |
|---|---|---|---|
| 4,953,113 | 8/1990 | Chadima, Jr. et al. | 361/680 |
| 4,970,625 | 11/1990 | Belanger et al. | 361/424 |
| 4,983,818 | 1/1991 | Knowles | 235/472 |
| 4,988,247 | 1/1991 | Summerlin | 411/38 |
| 5,052,943 | 10/1991 | Davis | 439/357 |
| 5,064,388 | 11/1991 | Paladel | 439/607 |
| 5,219,252 | 6/1993 | Schruff | 411/34 |
| 5,394,436 | 2/1995 | Meier et al. | 375/202 |
| 5,504,659 | 4/1996 | Actay et al. | 361/818 |
| 5,517,434 | 5/1996 | Hanson et al. | 364/708.1 |

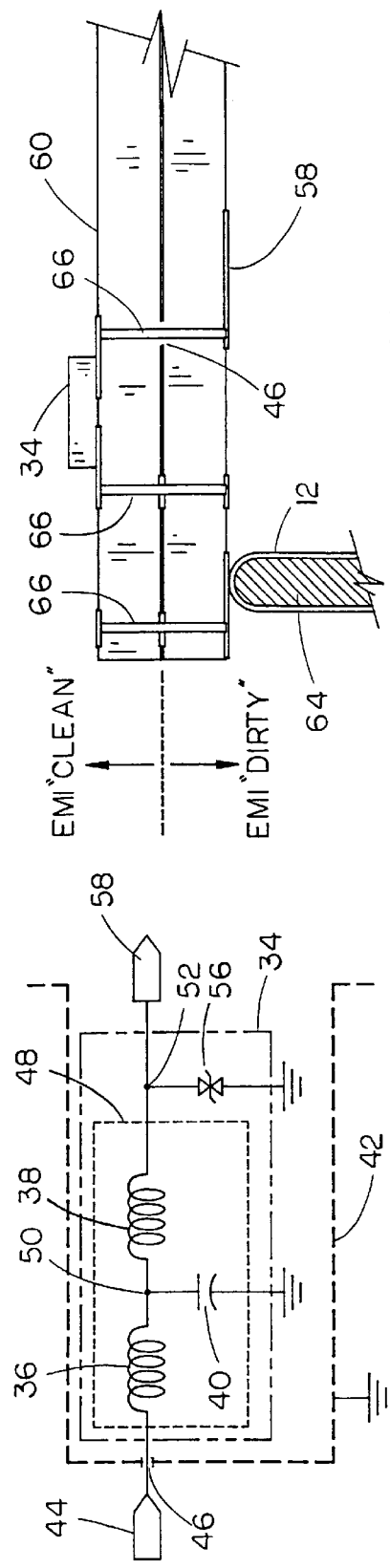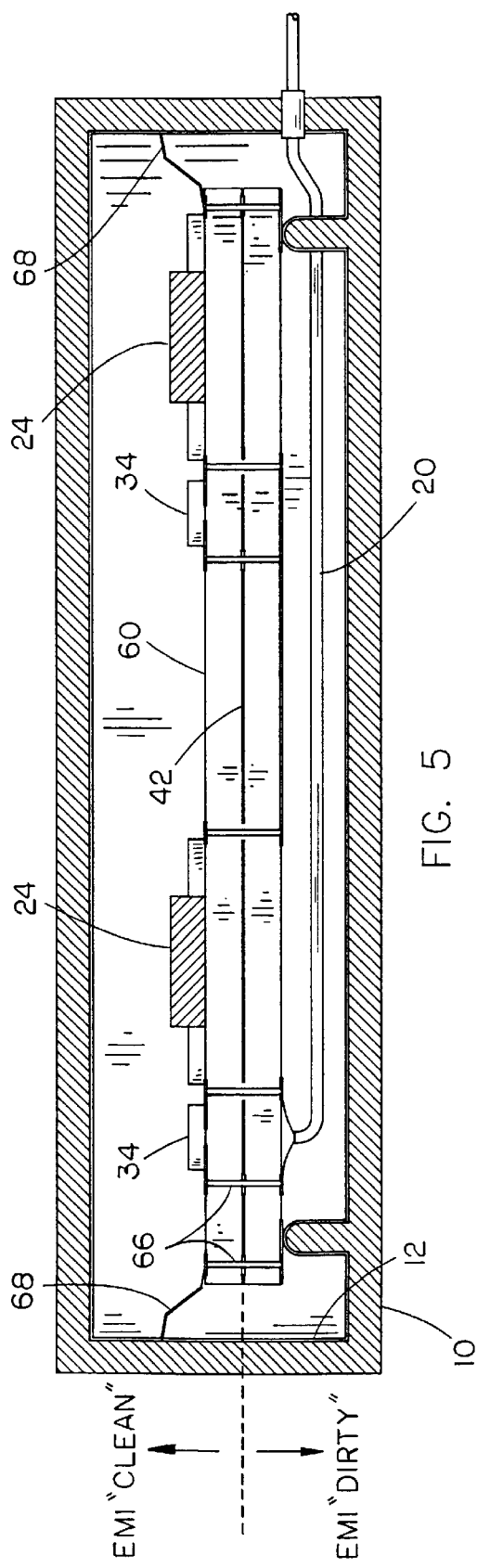

METHOD AND APPARATUS FOR ELECTROMAGNETIC SHIELDING AND ELECTROSTATIC DISCHARGE PROTECTION

CROSS-REFERENCE TO RELATED APPLICATION

The present application is a continuation-in-part of U.S. application Ser. No. 08/353,778 filed Dec. 12, 1994 (abandoned). The present application is also a continuation-in-part of U.S. application Ser. No. 08/171,390 filed Dec. 21, 1993 (U.S. Pat. No. 5,517,434 issued May 14, 1996). Said application Ser. No. 08/171,390 is in turn a continuation-in-part of U.S. application Ser. No. 07/561,994 filed Jul. 31, 1990 (abandoned).

The present invention may be utilized in a data terminal having a shock mount carrier system as described in U.S. Pat. No. 5,394,306 issued Sep. 7, 1993. Said U.S. Pat. No. 5,394,306 is incorporated herein by reference.

TECHNICAL FIELD

The invention relates generally to electromagnetic shielding electrostatic discharge protection and particularly to electromagnetic shielding electrostatic discharge protection of portable data terminals.

BACKGROUND OF THE INVENTION

Advents in the performance of microcomputer based electronics have resulted in dramatic increases in operating speeds of the logic switching circuits. Increased switching and operating speeds correspond to increased bandwidths of the electronic signals transmitted within the interior of a data terminal which become a significant source for electromagnetic radiation causing interference with the internal circuitry of the terminal itself and with other electronic devices operating within the vicinity of the data terminal. The electromagnetic radiation emitted at these higher frequencies may cause undesirable electromagnetic coupling between data paths resulting in crosschannel interference.

The amount of internally generated electromagnetic radiation must be limited to the guidelines and regulations set by governmental agencies such as the FCC in the United States and CISPR in European countries. Sources of electromagnetic radiation originating externally to the data terminal may also affect and interfere with the operation of the data terminal. In general the problems resulting from unwanted electromagnetic radiation are classified as electromagnetic interference (EMI).

Another significant contributor to operating malfunctions and faults in the ordinary course of terminal operations is electrostatic discharge (ESD). High density coulombic charge may accumulate on the terminal operator who then transfers the charge to the terminal when contact is made with the terminal. Other arbitrary sources of a concentrated electrostatic charge may be present in the operating environment with which the terminal may come into contact. The static discharge may generate electrostatic potential of a magnitude sufficient to interfere with the electronic signals within the terminal, cause a loss of stored data or even damage sensitive electronic components. Both the EMI and the ESD phenomena may cause valuable data to be lost or may cause the terminal to lock up or otherwise malfunction.

The intentional blocking of an electric, magnetic or electromagnetic field is referred to as shielding and is well known in the art. The concept of shielding is founded upon electromagnetic field theory through the application of Gauss' law. Gauss' law states that the net electric flux passing through any closed gaussian (mathematical) surface equals the net charge contained inside that surface divided by the permittivity of free space. Gauss' law is mathematically represented by one of Maxwell's equations, as applied to free space, which describes the net electric flux passing through any closed surface:

$$\oint E dA = Q/\epsilon_o$$

where E is total electric field intensity at any point on the surface, A is the surface area, Q is the electric charge contained within the surface, and $\epsilon_o$ is the permittivity of free space.

Thus the net electric flux contained within any gaussian surface is the surface integral of the electric field intensity on the surface which is also equal to the net charge within the surface divided by the permittivity of free space. Shielding employs a continuous metallic conductor as the gaussian surface. When an external field such as from an external source of electromagnetic radiation is applied to the surface the free electrons of the conductor are accelerated due to the externally applied field. The electrons are distributed in such a way that the electric field generated by the electrons opposes the externally applied electric field. The surface charge density then increases until the magnitude of the electric field set up by these charges equals that of the externally applied field, giving a net field of zero inside the conductor. Thus the conductor surface shields the interior of the conductor from the effects of externally applied electric fields.

In a good conductor, the time that it takes the conductor to reach electrostatic equilibrium where there is no net movement of electric charge is on the order of $10^{-16}$ s, which for most purposes can be considered instantaneous, that is when the frequency of the externally applied electric field is much less than 10 petaherz ($10^{16}$ Hz). When the conductor is in electrostatic equilibrium the net charge within the conductor is zero.

If the net electric charge within the surface is zero, then the net electric flux will also be zero, and therefore the net electric field is zero everywhere inside the conductor. If the surface is a closed conductive surface, then no charge can enter or leave the surface; all of the charge is contained harmlessly on the surface of the conductor. Thus the net electric charge inside a gaussian surface is zero where the closed gaussian surface comprises a conductor.

The magnetic analog to Gauss' law describing the net electric flux within a gaussian surface is Gauss' law in magnetism. This law states that the net magnetic flux through a closed surface is always zero. Gauss' law in magnetism is stated as one of Maxwell's equations describing the net magnetic flux within a closed gaussian surface:

$$\oint E dA = 0$$

where B is the magnetic flux density, and A is the surface area. Implementation of magnetic shielding requires a magnetic material to block the lines of magnetic flux in a nonfluctuating magnetic field. The ideal material for shielding electromagnetic radiation exhibits both high electrical conductivity and magnetivity such that the magnetic permeability is greater than one, or a paramagnetic material.

No known shielding barrier stops 100 percent of the electromagnetic radiation that it is designed to block. The percent of energy that is blocked is called the shielding effectiveness. Shield continuity, the effectiveness of shielding, is a measure of the degree to which a shield confines or inhibits the electromagnetic field. This parameter depends upon the frequency of the electric field. Shielding becomes less effective with increasing frequencies of the electromagnetic fields. Therefore shield continuity is of increasing importance as the frequency increases.

The effectiveness of an electromagnetic shield is a function of the continuity, or physical completeness, of the barrier. The shield continuity factor is defined as the ratio of the actual shield conductor surface area to the total surface area which the shield area encloses, or:

$$C = A_c/A_t$$

where C is the shield continuity factor, $A_c$, is the surface area of the shield conductor and $A_t$ is the total surface area which the shield encloses.

A solid metal enclosure, with absolutely no holes or gaps and with an excellent conductor provides 100 percent shielding continuity. If there are holes or gaps within the shielding, the effectiveness will be less than 100 percent. If it were possible to build a data terminal with a continuous, uninterrupted conductive shield, clearly no charge could enter or leave the terminal. Unfortunately, practical terminals have electrical input and output paths and openings required for displays, keys and the like. If the shield enclosure is not continuous, the opening should be very small compared with the wavelength of the electromagnetic field. Consequently, electrical signals entering and leaving the data terminal must be considered and treated to approximate the ideal closed surface shield.

Typical shielding methods known in the art coat the inside shell of a data terminal case fabricated of injection molded plastic with a paramagnetic electrically conductive material. However, the required openings in the terminal such as for input/output connectors, display and keypad prevent the shield from creating a completely closed surface. Therefore the shielding continuity factor will be less than one (i.e. less than 100 percent shielding effectiveness). Additionally the data paths interconnecting the internal circuitry itself are within the volume enclosed by the shield so that the shield is ineffective against mutual electromagnetic coupling of the internal circuitry.

As frequencies of operation increase in electronic circuits, circuit theory assumptions are no longer valid and field effects become significant. Thus in a standard circuit board layout of high frequency circuits field effect problems occur wherein all data paths are mutually coupled with all other data paths in the vicinity. Signals generated on one data path will stray to data paths in the nearby vicinity because of field effect coupling. Not only will erroneous signals be sent to the wrong components, but the stray field effects will cause an alteration in the impedances along the data paths. The altered impedances cause errors in data transmission and may lead to an increase in power consumption. Standard shielding will not prevent these problems which become more prevalent at greater bandwidths. Thus the bandwidths allowed by the prior art have an upper limit because of these field effects.

Another problem encountered with the prior art is the length of conducting cable that couples the circuitry with an entry point at the enclosing shielding surface. Traditionally, effective connection of electronic components requires mounting of the components on a printed circuit board assembly that generally also contains the processor, memory, and logic devices. Signals are typically routed and connected to the circuit board through some length of cabling which may unintentionally act as a transmitting antenna and radiate electromagnetic waves internally within the enclosing shielding surface to the circuitry of the data terminal thereby rendering the shielding ineffective against this source of EMI and causing interference with the operations of the data terminal. External input/output cables connected to the data terminal may also act as a receiving antenna by receiving external sources of EMI or ESD superimposed onto the signals carried on that cable and act as a transmission line by carrying the unwanted electromagnetic radiation to the internal components of the data terminal.

A possible solution to this problem is to provide treatment of the signal at the entry point of the terminal. However, such treatment is often either too costly or too impractical to implement in the constrained space of a small terminal. Treating signals which enter or leave a shield enclosure is often difficult requiring complex and specialized methods and processes to integrate shield enclosures with plastic components. In addition, signal treatment at the outer boundary opening will only reduce EMI from external sources but will not be effective against internally generated EMI. Further, computer type devices often have multiple access requirements for batteries, memory cards, and the like which further complicate achieving effective shielding.

High power and high speed circuits require a low impedance path for return current to minimize voltage potential differences between connected points in an electronic system. Ground is commonly the reference potential that logic circuits use for operation of digital circuits. Voltage potential differences along portions of the ground network may cause increased noise emissions and even circuit malfunctions. Typically a ground plane is employed to minimize ground potential by providing a low impedance circuit path on the ground network. Unfortunately the impedance of the ground plane is finite. As a result, an increase in the switching speeds of logic circuits results in increased switching currents thereby causing the existence of noise in the ground plane to be unavoidable. Consequently, the ground plane does not function as an effective shield as it may contain noise current that may be coupled to cables and other conductors that may radiate such noise as EMI. Designs which implement the ground plane as the same physical instrumentality as the shield invariably do not provide effective shielding at higher logic signal bandwidths.

SUMMARY OF THE INVENTION

The present invention is directed to a method and apparatus that satisfies the need to protect a data terminal from external sources of electromagnetic interference and electrostatic discharge. The method and apparatus taught by the present invention is also directed at protecting the data terminal from internally generated electromagnetic interference. Another end sought by the invention is to reduce the electromagnetic radiation emitted by the invention into the environment. The upper limit on operational bandwidth may be increased by reducing field effect problems.

The solution taught by the invention is to combine the concepts of signal treatment at the signal entry and egress points. Further taught by the invention is the use of an inner shield plane layer physically differentiated from the ground plane layer in conjunction with a multi layer printed circuit board for effective physical placement and access to the shield barrier. Untreated internal cabling may be routed anywhere within the data terminal and yet remain exterior to the effective shield barrier.

It is therefore an object of invention is to teach a shielding method and apparatus for a portable data terminal that closely approximates a completely closed gaussian surface.

It is another object of the invention to teach a shielding method that results in high shielding continuity.

Another object of the invention is to teach a simplified method of managing and controlling the electromagnetic emissions of computer devices, especially miniaturized portable computers.

It is a further object of the invention teach a shielding method that will raise the practical upper limit of the operational bandwidth by a reduction of the problems due to field effects.

Another object of the invention is to teach a shielding method that is cost effective, easy to fabricate and assemble and meets EMI and ESD performance requirements.

A further object of the invention is to teach a shielding method that uses ordinary electronic fabrication and construction methodology to achieve the shielding objectives.

It is yet another object of the invention to teach a shielding method that may be implemented as an embedded portion of an ordinary circuit board such as is typically used to mount and interconnect the electronic components of an electronic device.

An additional object of the invention is to teach a shielding method that eliminates the need for complex enclosure shielding processes.

It is another object of the invention to physically differentiate the shielding layer from the grounding layer.

Another object of the invention is electrical connection of the physically differentiated ground and shield layers at a single strategically located point which thereby eliminates interference that would be caused if they were not so differentiated.

BRIEF DESCRIPTION OF THE DRAWINGS

FIG. 3 is a diagram of an exemplary signal treatment circuit and the relation of the signal treatment circuitry to the electromagnetic shield.

FIG. 4 is a depiction of the invention implemented in conjunction with a circuit board.

FIG. 5 is a depiction of the invention as implemented in a data terminal.

DESCRIPTION OF AN EXEMPLARY EMBODIMENT

Figure 1:
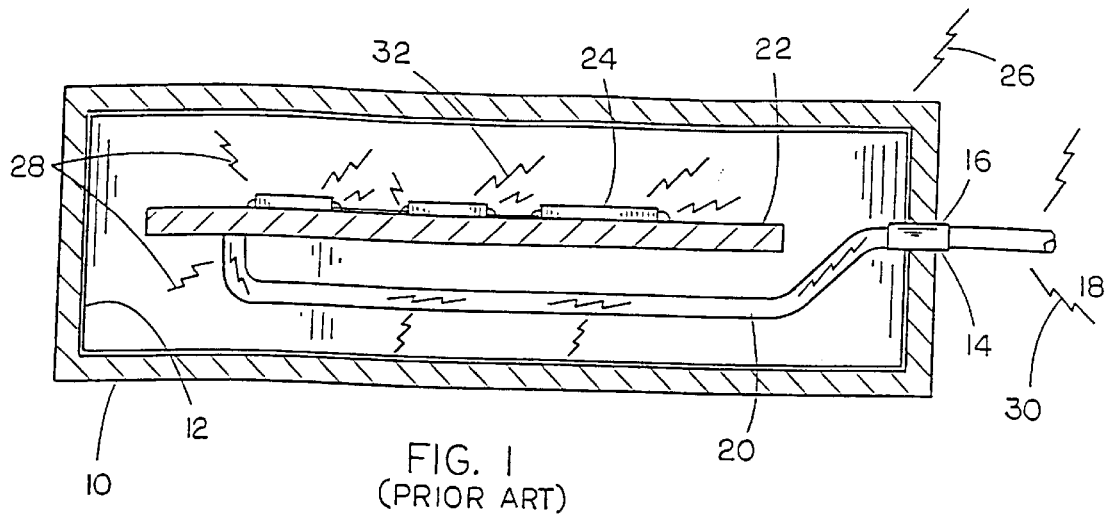
FIG. 1 illustrates a typical data terminal employing conventional method of electromagnetic shielding.

FIG. 1 shows a typical shielding implementation as employed in the prior art. The data terminal comprises an injection molded plastic shell 10 with a thin shielding conductor 12 affixed to the interior surface of the shell 10. An opening 14 in the shell 10 and shielding is fitted with a connector 16 to allow for input and output communications. An external cable 18 is a communications transmission line for routing data signals to or from external devices or networks. Internally, communications are routed from the connector 16 via internal cabling 20 to the electronic components 24 mounted on a printed circuit board 22.

In a typical shielding arrangement, the shielding 12 sufficiently blocks externally applied electromagnetic radiation 26 and internally generated electromagnetic radiation 28 directly incident upon the shielding 12, however because of the required opening 14 shielding effectiveness is less than 100 percent. Additionally the external cable 18 acts as an antenna and receives external sources of electromagnetic interference or electrostatic discharge 30. Thus undesired electromagnetic waves are transmitted directly to the internal electronics 24 or reradiated from the internal cabling 20 after passing through the opening 14 in the shielding 12. The result is undesired interference with the operations of the data terminal.

All of the connections on the circuit board 22 between the electronic circuit components 24 are interior to the shielding 12. These internal circuit connections may also be a source of undesirable electromagnetic radiation 32 causing unintended mutual field coupling between circuits and resulting in crosschannel interference. This problem is especially true at higher operational bandwidths where field effects become noticeable. In addition, even if EMI signal treatment were to be applied at the opening 14 of the shielding 12, signal treatment would not be effective against internal sources of EMI.

Figure 2:
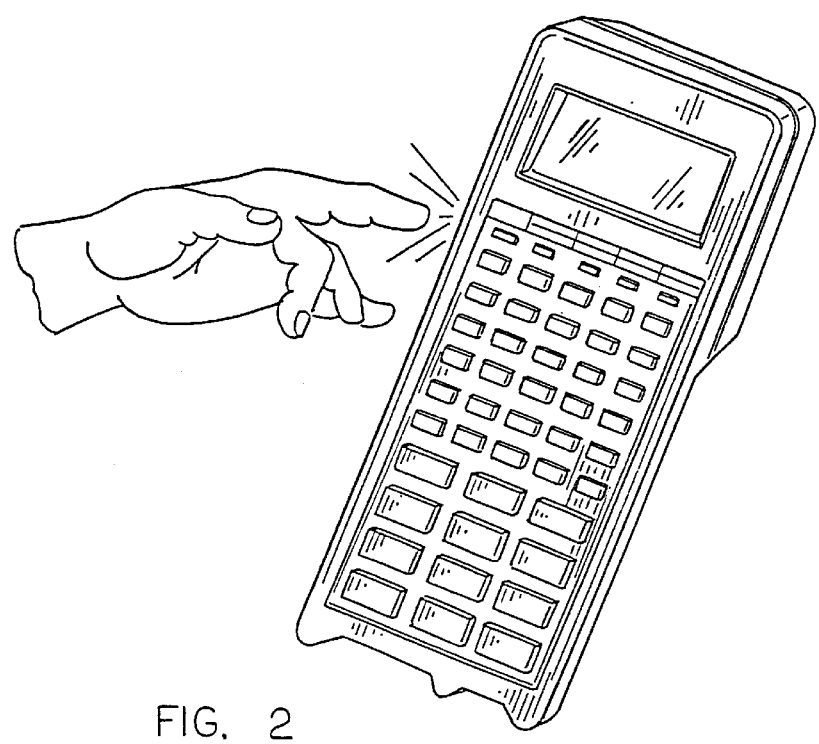
FIG. 2 depicts the electrostatic discharge phenomenon resulting from contact of the data terminal with an electrostatically charged operator.

FIG. 2 shows the electrostatic discharge (ESD) phenomenon. The hand of an operator may transfer an accumulated coulombic charge to the data terminal by coming into contact therewith. The data terminal may be deployed in myriad environments wherein electrostatic charge accumulation is difficult to mitigate and is frequently unavoidable.

FIG. 3 is the schematic diagram of the signal treatment circuitry 34 in an exemplary embodiment of the invention. The signal treatment circuitry 34 may be contained in a singular component which may be an AVX Transguard type device. Each point of signal entry and egress in the shielding 42 is a potential violation of the desired completely closed continuous gaussian surface. The internal signal line 44 connects through a small aperture or opening 46 in the shielding 42 such opening 46 being just large enough to allow the signal line to pass through the shielding 42 without making contact therewith. The signal line 44 then connects to an LC filter network 48 which is a "tee" configuration in an exemplary embodiment. The filter network 48 is comprised of two inductors 36 and 38 connected in series and a shunt capacitor 40 connected at the node 50 between the inductors. The shield 42 is connected to provide the ground reference for the filter network 48 and other circuitry connected to signal line 44.

The filter network 48 acts as a frequency limiter and low impedance electrical contact to the shield 42 surface. The values of the inductors 36 and 38 and the capacitor 40 may be selectable to achieve the desired cutoff frequency. The frequency limiting action of the filter network 48 allows desired frequency signal components to pass through the shield barrier 42 and causes undesired frequency signals, for example high frequency signals (which may be sources of interference), to be dissipated into the shield 42. This is tantamount to having a controlled opening in the shielding 42 that allows for entry and exit of desirable signals only but having effectively formed a completely closed shielding surface 42 for undesirable signals. Thus, the shield effectiveness or continuity approaches one hundred percent for signals of undesirable frequencies while signals of desired frequencies may simultaneously pass through the shield 42. The electrical symmetry of the filter network 48 allows for effective two-way treatment of signals both entering and leaving the shielding 42 through aperture 46.

Clamping device 56 shunts the filter network 48 and the external signal line 58 at node 52 and acts as a voltage limiter or clamp to provide effective electrostatic discharge protection. In this configuration, any voltage above a predetermined working voltage will be electrically coupled to the shield. Thus, desired signals below the predetermined working voltage may freely enter and exit the shield barrier 42. However, voltages above the predetermined voltage (those which are typical of the ESD phenomenon) will not pass through the shield barrier 42. Clamping device 56 may be selected according to the reverse voltage rating in order to set the predetermined working voltage. ESD protection is a one-way problem since protection from external discharge is the only requirement of the signal treatment circuitry 34.

FIG. 4 shows an embodiment of the invention as implemented in conjunction with a multilayer circuit board 60. The untreated external signal line 58 makes an electrical contact on one side of the circuit board 60. The contact for the untreated signal line 58 resides on the EMI "dirty" side of the circuit board in which undesirable electromagnetic radiation may exist. The untreated signal line 58 is electrically connected through the circuit board 60 by means of connection vias 66. The vias 66 provide electrical connections through the multiple layers of the circuit board 60. Thus passage of electrical signals are made through the circuit board 60 and the internal shield plane 42 from one planar surface to the other by appropriate and strategic connections to the vias 66 which pass completely therethrough. In an exemplary embodiment approximately sixty connection vias 66 are required.

The shield plane 42 electrically references to ground potential through the vias 66 throughout the entire circuit board 60. The plastic case provides a support 64 and an electrical contact of the shield plane 42 through the vias 66 to the shielding surface enclosure 12 which is affixed to the interior of the data terminal housing. Electrical continuity of the shield plane 42 and the sheilding surface enclosure 12 may thereby be maintained in the furtherance of attaining a completely closed gusssian surface having complete shielding continuity. In an exemplary embodiment for the frequencies of concern an effective shield 12 may be formed by a thin (0.001") layer of highly conductive material. The untreated signal line 58 connects to the clamp/filter component 34 through a via 66 which passes through a small aperture or opening 46 in the shield plane 42.

The clamp/filter component 34 performs signal treatment by removing unwanted EMI and ESD from the untreated signal line 58. Because of the action of the clamp/filter component 34 only desired signals penetrate the shield plane 42 and emerge on the EMI "clean" side of the circuit board 60 as a treated signal 44. The clamp/ filter component 34 causes any signal of a greater magnitude than the predetermined potential (i.e. electrostatic discharge) to be shorted to ground such that it is prevented from passing through the shield plane 42. The clamp/filter component 34 also causes signals of a frequency greater than a predetermined frequency (which cause electromagnetic interference) to be shorted to ground such that they are prevented from passing through the shield plane 42 as previously discussed in the description of FIG. 3.

FIG. 5 shows an exemplary embodiment of the invention in which electronic components may be mounted on the EMI "clean" side of the circuit board 60 while all routing of data paths and external connections may be made on the EMI "dirty" side of the circuit board 60. Shield contacts 68 further electrically connect the shield plane 42 of the circuit board 60 to the shield barrier coating 12 affixed to the internal side of the plastic case 10 of the data terminal in order to provide good electrical contact with the shield barrier 12 and approximate as closely as possible a continuous gaussian surface. As shown in FIGS. 4 and 5, selected connection vias 66 are electrically connected to the shield plane 42 such that electrical continuity may be maintained, for example, from the inner shielding conductor surface 12 through shield contacts 68 to connection vias 66 to shield plane 42 thereby forming a continuous gaussian surface and attaining shielding continuity.

In an exemplary embodiment the internal electromagnetic radiation emitted from the internal cabling 20 will not interfere with the circuit components 24 because all signal routing is exterior to the shielding plane 42 of the circuit board 60 on the EMI "dirty" side of the data terminal.

Thus, various clamp/filter components 34 may be placed at locations on the circuit board 60 where it is desired to have electrical signals pass through the shield 42. Connection through the shield 42 is achieved using strategically located vias 66. For example connection vias 66 connect routing cable on the EMI "dirty" side of the shield 42 to electronic components 24 on the EMI "clean" side of the shield 42. A clamp/filter component 34 may treat the signal from the routing cable 20 such that the signal routed to the electronic components 24 thereby becomes EMI "clean." It should be noted that one terminal of a clamp/filter component 34 is connected to a via 66 having electrical continuity with the shield 42 while the other terminal is connected to a via 66 not in electrical contact therewith but passing therethrough. The electrical diagram of the clamp/filter 34 and shield 42 arrangement is illustrated in FIG. 3.

Figure 6:
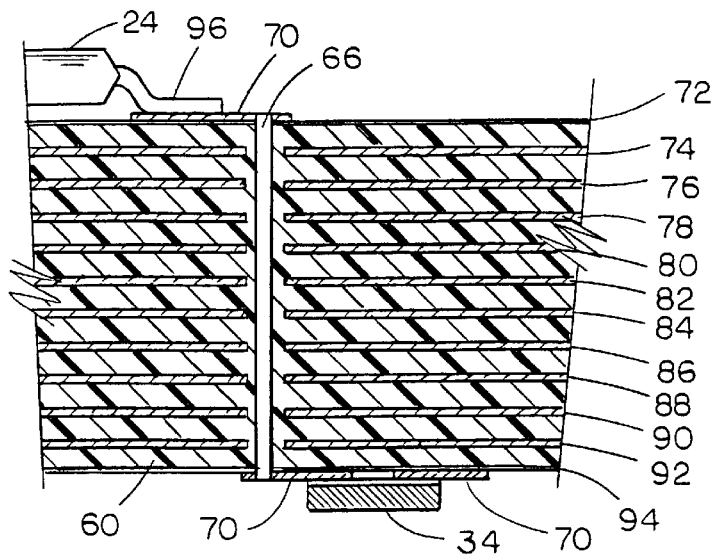
FIG. 6 is an exemplary application of the invention in a twelve layer printed circuit board.

FIG. 6. illustrates an exemplary embodiment of the invention using standard printed circuit board construction. The teachings of the invention are extended to further improve the shielding results and effectiveness. Differentiation of the shielding and grounding functions is applied in order to attain the desired results. A shield is used primarily to perform containment of electromagnetic fields generally attributable to EMI problems. Any current flowing in a shield is solely caused by sources electromagnetic interference. A ground provides a return path for the power and signal current and also provides an electrical reference for the electrical circuitry. The shield is ultimately electrically coupled to ground, however it has been discovered that strategic location of such electrical connection is necessary to minimize the impact of the flow of interference current in the shield on the integrity of the ground reference upon which desired signals depend. Coupling between the shield and the ground is most preferably located at a single, central connection point so that no additional parasitic or multiple parallel current paths for interference current flow are created.

Circuit board 60 is comprised of twelve layers each of which serving a predetermined purpose. An electrical contact terminal of integrated circuity 24 disposed on one side of circuit board 60 may electrically connect to one of the multiple connection vias 66 by connection to one of several component pads 70 which comprise a first component pad layer 72 of circuit board 60. The component pads 70 minimize the length of signal routing which may be itself a source of EMI. The vias 66 provide an electrical circuit path through circuit board 60 which passes completely through one planar side of circuit board 60 to the other.

A first shield plane 74 near the integrated circuit 24 side of printed circuit board 60 is the next successive layer. The purpose of shield 74 is to provide a conductive surface that becomes a return path for noise and interference current. The shield 74 is kept physically separate from any ground layer 76 or 80 except at strategic locations, preferably at a single point, because a ground plane is often an ineffective mechanism for EMI treatment due to the fact that high frequency signal current may be present in the ground plane, thereby being a possible source for internally generated EMI. The key to shielding effectiveness is the integrity of the shield layer 74. It is desirable to couple the shield 74 to ground 76 or 80 only when necessary. Thus, the shield 74 and the ground 76 and 80 are differentiated i.e. they are physically not the same element, and electically they are coupled at only one node.

Fast clocks signal layer 78 provides the necessary clock signal required to drive the circuitry of the integrated circuits 24. FIG. 6 depicts the connection of fast clocks signal layer to a connection via 66 and the ultimate connection of the fast clocks signal to a clock pin 96 of integrated circuit 24, for example. Connection of the other various layers of circuit board 60 to other pins of integrated circuit 24 may be accomplished with other connection vias 66 not depicted. Layers 82, 84 and 86 may carry and route various other signals to various other pins of the integrated circuits. The fast clocks layer 78 may also be used for general purpose signal routing if physical space on the fast clocks plane 78 is available. VCC layer 92 provides a low impedance power feed plane to route power to integrated circuits 24.

As can be seen from FIG. 6, fast clocks layer 78 is sandwiched between respective ground layers 76 and 80, a technique known in the art for improved high speed signal propagation and impedance control. The sandwich arrangement also allows for further isolation of high speed signals such as fast clocks having the highest desired frequency, which may in themselves be a significant source of EMI, from the shield 74 which is desirably as noise free as possible. Differentiation of the shield 74 from the ground layers 76 and 80 augments the effect of sandwiched fast clock signals by preventing any high frequency current of the fast clocks 78 signals from flowing in the shield 74 and becoming a source of EMI.

A second shield plane 92 is placed near a planar side of circuit board 60 opposite to the placement of integrated circuits 24 adjacent to component pad layer 94. Using two shield layers 74 and 92 is such a manner essentially is a physical collapsing of the volume delineated by a typical shield layer 12 (FIG. 1) into an actual and otherwise ordinary multilayer circuit board 60 itself. Thus, the shield layer coating 12 affixed to the interior of a terminal shell 10 may be eliminated. Shield layers 74 and 92 are electrically connected by multiple vias 66 typically located near the edges of circuit board 60 and to the ground planes 76 and 80 at a single point.

A second component pad layer 94 may be disposed on the planar surface of circuit board 60 opposite the planar surface in which integrated circuit components 24 are mounted. Clamp/filter components 34 may be mounted on the second component pad layer 94 on which side cabling connections from external devices may be made as well. The planar side of circuit board 60 to which the clamp/filter components are affixed may be considered the EMI "dirty" side while the planar side of circuit board 60 to which the integrated circuits 24 are affixed may be considered the EMI "clean" side (see FIG. 4).

Figure 7:
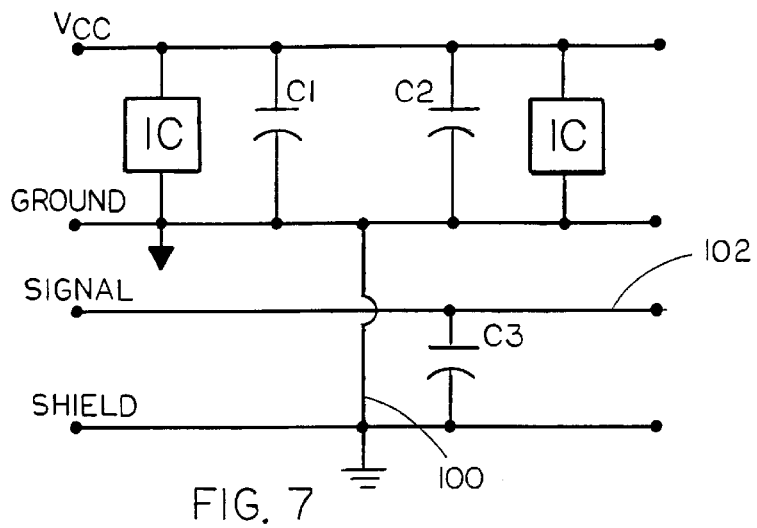
FIG. 7 depicts the electrical relationship between a ground layer and a shield layer in an exemplary embodiment of the invention.

FIG. 7 illustrates the connection between shield layers 74 and 92 ground planes 76 and 80. The manner in which connection is made between the shield layers 74 and 92 and ground planes 76 and 80 is essential to the solution which the invention teaches. Most importantly, connection between the SHIELD and GROUND is made at a single point with connector component 100 so that there is no alternate path for power current or signal current to flow through the SHIELD and thereby be a potential source of EMI.

The SHIELD as shown in FIG. 7 is the return point for the filter capacitor C3 which removes high frequency noise which may be present from the external cable 102 to preserve the integrity of the SIGNAL line. With a single point connection 100 between GROUND and SHIELD there is no short circuit return path for power current or signal current to flow from GROUND to SHIELD and back to GROUND. Such current is often referred to as "ground loop" current notorious for noise generation as "hum" in audio circuits or as EMI in computer circuits.

The relative capacitance value of the filter capacitor C3 may be much smaller than the capacitance of the bypass capacitors, C1 and C2 for example, associated with the power supply circuit of the integrated circuits (IC). The bypass capacitors C1 and C2 shunt the supply voltage VCC to GROUND and provide current for the high speed transient requirements of the integrated circuits. The bypass capacitors C1 and C2 must have sufficient capacitive charge storage capability and a sufficiently low inductance to be able to quickly deliver a stored charge. The filter capacitor C3 provides an effective high frequency connection to the SHIELD by appearing as a low impedance to high frequency signal components while appearing as a high impedance to low frequency signal components so that low frequency signal components pass through the SHIELD unaffected. It is important that filter capacitor C3 functions an electrically quiet return path for high frequency signals. If the return point for high frequency signals is electrically noisy, high frequency noise may be undesirably coupled through the filter capacitor C3 to the external cable 102.

The SHIELD is electrically connected to GROUND at preferably only one point with connector 100. The location of the connection point between the SHIELD and GROUND may be generally located in the center area of the circuit board 60. The connector component 100 preferably may be a shorting bar or 0 ohm resistor to allow for verification of the integrity of the electrical isolation of the GROUND and SHIELD planes.

The purpose of the SHIELD is solely to provide a return circuit path for noise current to flow so that it may not penetrate therethrough in accordance with Gauss' law. The SHIELD is not to be used to provide a ground path for power or signal distribution current, which is the purpose of the GROUND. It is therefore desirable to prevent high frequency signal current from flowing in the SHIELD, yet is also desired to electrically couple the SHIELD to ground reference. In an alternative embodiment connector component 100 may be an inductor such that the connection 100 between the GROUND and the SHIELD appears as a high impedance to high frequency signals yet the connection 100 appears as a short circuit to low frequency signals. This is true because the magnitude of the impedance of an inductor having no initial current flowing therethrough is:

$$Z=2\pi fL$$

where Z is the magnitude of the impedance of the inductor, f is the signal frequency and L is the inductance value of the inductor.

Figure 8:
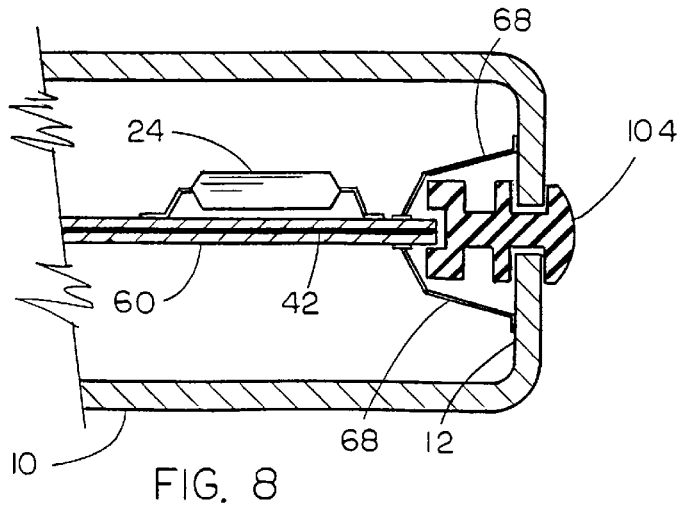
FIG. 8 illustrates an application of the invention in conjunction with a shock absorbent packaging apparatus.

FIG. 8 illustrates utilization of the present invention in a data terminal having shock absorbent packaging apparatus as described in U.S. Pat. No. 5,394,306 issued Feb. 28, 1995 assigned to Norand Corporation, Cedar Rapids, Iowa. A data terminal housing 10 may be constructed to have a shock mount carrier system to provide shock protection to the electronic components 24 of an internal printed circuit board 60. Circuit board 60 is physically supported or carried by a rubber-like bumper and gasket component 104 which serves as a shock absorbing cushion. As previously described, shield contacts 68 further connect the shield plane 42 of the circuit board 60 to the shield barrier coating 12 affixed to the internal side of the plastic case 10 of the data terminal in order to provide good electrical contact with the shield barrier 12 and approximate as closely as possible a continuous gaussian surface having complete shield effectiveness.

In this embodiment, shield contacts 68 are made of a flexible conductive material of a sufficient length so that the integrity of the shield contacts 68 is maintained during slight movements of the circuit board inherently caused by the shock absorbing process. The shielding contacts 68 have a current carrying capacity sufficient to maintain electrical continuity between the internal shield coating 12 and the shield plane 42 through electrical connection to connection vias 66. Thus, continuous physical and electrical contact is maintained between the shield contacts 68 and the internal shield coating 12 and the shield plane 42 during normal rotation, compression and extension or other movement of the shock absorber 104. The shock absorber component may be utilized in lieu of support member 64 shown in FIGS. 4 and 5.

In view of the above detailed description of a preferred embodiment and modifications thereof, various other modifications will now become apparent to those skilled in the art. The claims below encompass the disclosed embodiments and all the reasonable modifications and variations without departing from the spirit and scope of the invention.

What is claimed is:

1. An apparatus for providing protection from electromagnetic interference, comprising:
    (a) a shielding conductor surface enclosure;
    (b) a shielding conductor plane interior to said shielding conductor surface enclosure;
    (c) means for providing electrical continuity between said shielding conductor surface enclosure and said shielding conductor plane;
    (d) at least one aperture in said shielding conductor plane for providing passage of electrical signals through said shielding conductor plane;
    (e) an electrical path through each of said at least one aperture in said shielding conductor plane; and
    (f) frequency based signal separation means connected between said shielding conductor plane and said electrical path for separating electrical signals present on said electrical path wherein frequency components within a predetermined range of frequencies are electrically connected to said shielding conductor plane such that said shielding conductor plane and said shielding conductor surface appear as a completely enclosed and continuous conductor surface to the frequency components within the predetermined range of frequencies.

2. The apparatus according to claim 1, wherein said shielding conductor surface enclosure and shielding conductor plane are composed of magnetic and electrically conductive material.

3. The apparatus according to claim 1, wherein said shielding conductor plane is incorporated within a circuit board.

4. The apparatus according to claim 1, wherein said frequency based signal separation means includes a filter network.

5. The apparatus according to claim 4, wherein said filter network comprises:
    (a) a first inductor
    (b) a second inductor electrically connected in series at an electrical node with said first inductor; and
    (c) a shunting capacitor electrically connected at the electrical node with said inductors.

6. A method for protecting a data terminal from electromagnetic interference and electrostatic discharge comprising:
    (a) filtering electrical data signals present within the data terminal such that the electrical signals are separated into multiple frequency ranges;
    (b) electrically coupling the electrical data signals within a first frequency range to a shielding surface such that the shielding surface appears as a continuous shielding surface;
    (c) passing the electrical data signals within a second frequency range through the shielding surface; and
    (d) electrically coupling the electrical signals of an electrostatic potential greater than a predetermined electrostatic potential to the shielding surface.

7. In an electronic device having a housing and an electronic circuit disposed within the housing, an apparatus for preventing undesirable electromagnetic signals from penetrating the housing and interfering with the electronic circuit while allowing a desirable signal to pass through the housing and couple with the electronic circuit, comprising:
    a conductor surface coincident with an interior surface of the housing for shielding the electronic circuit from the undesirable electromagnetic signals, said conductor surface exhibiting a shielding effectiveness and having an aperture for allowing the desirable signal to pass therethrough; and
    a filter operatively connected between the electronic circuit and said conductor surface wherein signals having frequency components characteristic of the desirable signal are coupled by the filter to the electronic circuit and signals having frequency components characteristic of the undesirable electromagnetic signals are coupled by the filter to said conductor surface, thereby increasing the shielding effectiveness of said conductor surface against the undesirable electromagnetic signals.

8. An apparatus as claimed in claim 7, wherein said filter is a low pass filter.

9. An apparatus as claimed in claim 7, wherein said filter is a high pass filter.

10. An apparatus as claimed in claim 7 wherein said filter is a band pass filter.

11. An apparatus as claimed in claim 7 wherein said filter is a band reject filter.

12. An apparatus as claimed in claim 7, wherein said filter comprises first and second inductors each having first and second terminals, respectively, the second terminal of said first inductor and the first terminal of said second inductor being connected at a node, the first terminal of said first inductor receiving the desirable signal, and the second terminal of said second inductor being coupled to the electronic circuit; and a capacitor connected between the node and said conductor surface.

13. In an electronic device having a housing and an electronic circuit disposed within the housing, an apparatus for preventing undesirable electromagnetic signals emanating from a transmission line disposed within the housing from interfering with the electronic circuit, comprising:

a first conductor having a surface coincident with an interior surface of the housing for shielding the electronic circuit from the undesirable electromagnetic signals;

a second conductor disposed within the housing, said second conductor being generally planar and having an upper surface and a lower surface, the circuit being disposed above the upper surface and the transmission line being disposed below the lower surface; and a shield contact for connecting said first conductor to said second conductor thereby providing shielding continuity between said first and second conductors by enclosing a volume containing the electronic circuit and excluding the transmission line such that the electronic circuit is shielded from the undesirable electromagnetic signals emanating from the transmission line.

14. A circuit board for preventing undesirable electromagnetic signals emanating from a transmission line from interfering with an electronic circuit disposed on a surface of the circuit board, comprising:

a first conductor being disposed between the electronic circuit and the transmission line and having an aperture through which a desired signal transmitted via the transmission line may pass for coupling with the electronic circuit, said first conductor providing a surface for shielding the electronic circuit from the undesirable electromagnetic signals emanating from the transmission line; and a second conductor disposed on said circuit board for providing a return current path for the desired signal separate from said first conductor wherein said first conductor and said second conductor are connected at a single point.

15. A circuit board as claimed in claim 14, wherein the transmission line is disposed between said first conductor and said second conductor.

16. An apparatus for providing protection from electromagnetic interference, comprising:

first means for providing electromagnetic shielding, said first electromagnetic shielding means having an aperture formed thereon for providing passage of desired electrical signals therethrough;

second means for providing electromagnetic shielding, said second electromagnetic shielding means at least partially enclosing said first electromagnetic shielding means wherein said first electromagnetic shielding means separates an interior region of said second electromagnetic means into at least first and second interior regions of said second electromagnetic shielding means; and means for coupling electrical signals of a first range of frequencies to said first means for providing electromagnetic shielding and for allowing electrical signals of a second range of frequencies to pass through the aperture from the first interior region to the second interior region.

17. An apparatus as claimed in claim 16, said first and second electromagnetic shielding means being electrically coupled.

18. An apparatus as claimed in claim 16, said first electromagnetic shielding means being integrated within a means for mounting an electrical component.

19. An apparatus as claimed in claim 16, further comprising means for limiting electrical signals passing through said aperture to a predetermined voltage level.

20. An apparatus as claimed in claim 16, said coupling means including means for providing electrical reactance.

21. An apparatus, comprising:

means, capable of enclosing a circuit, for providing electromagnetic shielding of the circuit, said electromagnetic shielding means having an aperture for allowing a transmission line external to said electromagnetic shielding means to couple with the circuit; and means for coupling signals on the transmission line of a first frequency to said electromagnetic shielding means while allowing signals on the transmission line of a second frequency to pass through the aperture to the electronic circuit such that the shielding effectiveness of said electromagnetic shielding means is increased for signals of the first frequency.

22. An apparatus as claimed in claim 21, further comprising means for limiting signals on the transmission line passing through the aperture to a predetermined voltage level.

* * * * *